(12) United States Patent
Lee et al.

(10) Patent No.: US 11,158,885 B2
(45) Date of Patent: Oct. 26, 2021

(54) ELECTRONIC DEVICE AND METHOD OF DETECTING STATUS OF BATTERY THEREOF

(71) Applicant: Samsung Electronics Co., Ltd., Suwon-si (KR)

(72) Inventors: Yongsuk Lee, Suwon-si (KR); Hyunku Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 269 days.

(21) Appl. No.: 16/252,057

(22) Filed: Jan. 18, 2019

(65) Prior Publication Data
US 2019/0229379 A1   Jul. 25, 2019

(30) Foreign Application Priority Data

Jan. 19, 2018  (KR) .......................... 10-2018-0007209

(51) Int. Cl.
*H01M 10/42* (2006.01)
*H05K 5/00* (2006.01)
(Continued)

(52) U.S. Cl.
CPC ......... *H01M 10/4228* (2013.01); *G01M 3/38* (2013.01); *G06F 3/14* (2013.01); *H01M 10/425* (2013.01); *H05K 5/0017* (2013.01); *H05K 5/0086* (2013.01); *H05K 5/0213* (2013.01); *H01M 2010/4278* (2013.01); *H01M 2220/30* (2013.01)

(58) Field of Classification Search
CPC ........ G01M 3/00; G01M 3/40; G01M 3/3236; H01M 10/4228
See application file for complete search history.

(56) References Cited

U.S. PATENT DOCUMENTS 5,707,757 A * 1/1998 Lee .......................... H01M 2/12
  429/86
5,824,883 A * 10/1998 Park ..................... H01M 10/488
  73/40
(Continued)

FOREIGN PATENT DOCUMENTS

CH      707620 A2 *  8/2014  ............. G04G 17/08
CN     1582021 A  *  2/2005  ............. H04M 1/21
(Continued)

OTHER PUBLICATIONS

Fredrik Larsson et al., Toxic Fluoride Gas Emissions from Lithium-ion Battery Fires, Scientific Reports, Aug. 30, 2017. (Year: 2017).*
(Continued)

*Primary Examiner* — David A. Rogers (57) ABSTRACT

An electronic device includes a housing configured to form at least a portion of an outer surface of the electronic device; a battery disposed inside the housing; a circuit board disposed inside the housing; a gas sensor module including at least one gas sensor and mounted in the circuit board; and at least one wall disposed adjacent to the gas sensor module, wherein in the at least one wall, a first opening configured to introduce a gas leaked from the battery and a second opening configured to introduce air outside the electronic device are formed.

20 Claims, 6 Drawing Sheets

(51) Int. Cl.
*H05K 5/02* (2006.01)
*G01M 3/38* (2006.01)
*G06F 3/14* (2006.01)

(56) References Cited

U.S. PATENT DOCUMENTS

| | | | |
|---|---|---|---|
| 6,545,448 B1* | 4/2003 | Stanley | H01M 10/48 320/132 |
| 7,687,188 B2* | 3/2010 | Marubayashi | H01M 2/1241 429/53 |
| 8,417,303 B2* | 4/2013 | Ladouceur | H04M 1/0283 455/575.8 |
| 8,877,370 B2* | 11/2014 | Kim | H01M 2/34 429/185 |
| 9,042,592 B2* | 5/2015 | Chen | H04R 1/28 381/394 |
| 9,368,785 B2* | 6/2016 | Hirakawa | H01M 10/049 |
| 9,412,981 B2* | 8/2016 | Nakayama | H01M 2/1061 |
| 9,437,854 B2* | 9/2016 | Shimizu | H01M 50/20 |
| 10,135,960 B2* | 11/2018 | Han | H04M 1/72569 |
| 2007/0005267 A1* | 1/2007 | Li | H04M 1/72522 702/24 |
| 2007/0229294 A1* | 10/2007 | Vossmeyer | H01M 10/4207 340/636.19 |
| 2008/0128285 A1* | 6/2008 | Moon | G01N 27/4045 205/80 |
| 2010/0102975 A1* | 4/2010 | Vossmeyer | H01M 10/4207 340/636.19 |
| 2011/0027632 A1 | 2/2011 | Higashino et al. | |
| 2011/0059341 A1 | 3/2011 | Matsumoto et al. | |
| 2011/0086265 A1* | 4/2011 | Suzuki | H01M 2/0277 429/186 |
| 2012/0028089 A1 | 2/2012 | Mustakallio | |
| 2012/0040214 A1* | 2/2012 | Kim | H01M 2/1241 429/56 |
| 2012/0121942 A1* | 5/2012 | Kim | H01M 2/0426 429/7 |
| 2012/0208054 A1* | 8/2012 | Shirasawa | H01M 2/1077 429/90 |
| 2013/0071706 A1 | 3/2013 | Lee | |
| 2013/0095355 A1 | 4/2013 | Okutani et al. | |
| 2014/0174150 A1* | 6/2014 | Yajima | H01M 10/4228 73/23.2 |
| 2014/0272671 A1 | 9/2014 | Handa et al. | |
| 2014/0308550 A1* | 10/2014 | Shimizu | H01M 50/20 429/56 |
| 2015/0001076 A1* | 1/2015 | Porro | G01N 27/4045 204/412 |
| 2015/0118588 A1 | 4/2015 | McLean et al. | |
| 2015/0219608 A1 | 8/2015 | Choi et al. | |
| 2015/0303723 A1 | 10/2015 | Raghavan et al. | |
| 2015/0362451 A1* | 12/2015 | Hunziker | H01L 23/3107 73/31.06 |
| 2015/0380778 A1 | 12/2015 | Kim et al. | |
| 2016/0219194 A1* | 7/2016 | Barros | G02B 7/02 |
| 2016/0344068 A1 | 11/2016 | Kim et al. | |
| 2016/0351954 A1* | 12/2016 | Lee | H01M 10/058 |
| 2017/0144562 A1* | 5/2017 | Thomas | H04W 4/80 |
| 2017/0180523 A1* | 6/2017 | Fernandes | H04B 1/3888 |
| 2017/0205854 A1* | 7/2017 | Zenoff | G06F 1/163 |
| 2017/0318135 A1 | 11/2017 | Han et al. | |
| 2017/0322173 A1* | 11/2017 | Widenmeyer | G01N 33/0027 |
| 2018/0287224 A1* | 10/2018 | Ryoo | G01N 29/07 |
| 2018/0299417 A1 | 10/2018 | Cha et al. | |
| 2019/0025271 A1* | 1/2019 | Yan | G01N 33/0016 |
| 2019/0098121 A1* | 3/2019 | Jeon | H04M 1/18 |
| 2019/0207185 A1* | 7/2019 | Lee | H01M 2/1264 |

FOREIGN PATENT DOCUMENTS

| | | | | |
|---|---|---|---|---|
| CN | 1901584 A | * | 1/2007 | A62C 3/06 |
| CN | 102056757 A | | 5/2011 | |
| CN | 102414868 A | | 4/2012 | |
| CN | 102959761 A | | 3/2013 | |
| CN | 103477488 A | | 12/2013 | |
| CN | 107454245 A | | 12/2017 | |
| CN | 207095784 U | * | 3/2018 | G01M 3/04 |
| CN | 207600520 U | * | 7/2018 | |
| CN | 208971564 U | * | 6/2019 | H04B 1/3827 |
| CN | 209417009 U | * | 9/2019 | |
| JP | 04220955 A1 | * | 8/1992 | |
| JP | 11051798 A1 | * | 2/1999 | |
| JP | 2004363773 A1 | * | 12/2004 | |
| JP | 2007027011 A | * | 2/2007 | H01M 10/42 |
| JP | 2009277647 A | | 11/2009 | |
| JP | 5739926 B2 | | 6/2015 | |
| KR | 10-2015-0121658 A | | 10/2015 | |
| KR | 10-2016-0000742 A | | 1/2016 | |
| KR | 20160047200 A | * | 5/2016 | H01M 10/0525 |
| KR | 20160073141 A | | 6/2016 | |
| KR | 10-2017-0055216 A | | 5/2017 | |

OTHER PUBLICATIONS

Espacenet Machine Translation of CN 207095784 U Which Originally Published on Mar. 13, 2018. (Year: 2018).*
Espacenet Machine Translation of CN 208971564 U Which Originally Published on Jun. 11, 2019. (Year: 2019).*
Espacenet Machine Translation of KR 10-2016-0047200 A Which Originally Published on May 2, 2016. (Year: 2016).*
Espacenet Machine Translation of CN 1901584 A Which Originally Published on Jan. 24, 2007. (Year: 2007).*
Espacenet Machine Translation of JP 2007-27011 A Which Originally Published on Feb. 1, 2007. (Year: 2007).*
Google Translation of CN 1582021 A Which Originally Published on Feb. 16, 2005. (Year: 2005).*
M. Wenger et al., "Investigation of Gas Sensing in Large Lithium-ion Battery Systems for Early Fault Detection and Safety Improvement", 40th Annual Conference of the IEEE Industrial Electronics Society, Oct. 29-Nov. 1, 2014. (Year: 2014).*
ISA/KR, International Search Report and Written Opinion of the International Searching Authority, International Application No. PCT/KR2019/000771, dated Apr. 29, 2019, 9 pages.
Notification of the First Office Action dated Nov. 4, 2020 in connection with Chinese Application No. 201980006646.1, 23 pages.
Notification of Due Registration Formalities dated Aug. 18, 2021, in connection with Chinese Application No. 201980006646.1, 8 pages.

* cited by examiner

ELECTRONIC DEVICE AND METHOD OF DETECTING STATUS OF BATTERY THEREOF

CROSS-REFERENCE TO RELATED APPLICATION

This application is based on and claims priority under 35 U.S.C. § 119 to Korean Patent Application No. 10-2018-0007209, filed on Jan. 19, 2018, in the Korean Intellectual Property Office, the disclosure of which is incorporated by reference herein in its entirety.

BACKGROUND

1. Field

Various embodiments of the present disclosure relate to an electronic device and a method of detecting a status of a battery thereof, and more particularly, to an electronic device and a method of detecting a status of a battery thereof using a sensor and notifying a user of the battery status.

2. Description of the Related Art

Use of various electronic devices such as a smart phone, tablet personal computer (PC), portable multimedia player (PMP), personal digital assistant (PDA), laptop PC, wrist watch, and wearable device such as a head-mounted display (HMD) has been increased, and various functions may be performed through various electronic devices.

Various electronic devices may include batteries that provide power to perform various functions.

As electronic devices perform various functions, a capacity and rapid charge of a battery are becoming important problems. The battery may have different types and different environmental characteristics according to the use purpose of each of the electronic devices. As an electrolyte is decomposed because of overcharge, exposure to a high temperature, and an internal short circuit, the battery may generate a gas or may be ruptured.

SUMMARY

The present disclosure provides a structure of an electronic device that can detect a gas generated in a battery using a sensor.

The present disclosure further provides a method of controlling an electronic device by detecting a gas generated in a battery.

The present disclosure further provides an electronic device that can provide log information by detecting an abnormal event of a battery.

In accordance with an aspect of the present disclosure, an electronic device includes a housing configured to form at least a portion of an outer surface of the electronic device; a battery disposed inside the housing; a circuit board disposed inside the housing; a gas sensor module including at least one gas sensor and mounted in the circuit board; and at least one wall disposed adjacent to the gas sensor module, wherein in the at least one wall, a first opening configured to introduce a gas leaked from the battery and a second opening configured to introduce air outside the electronic device are formed.

In accordance with another aspect of the present disclosure, an electronic device includes a housing configured to form at least a portion of an outer surface of the electronic device and to form a first space therein; a battery disposed inside the housing; a circuit board disposed inside the housing; and a gas sensor module including at least one gas sensor and mounted in the circuit board, wherein the housing includes a first opening including a second space disposed in at least a portion of the first space and configured to dispose the battery within the second space and to introduce a gas leaked from the battery into at least a portion of the second space; and a second opening configured to introduce outdoor air into the electronic device in at least a portion thereof, and wherein the gas sensor is disposed in a partial area of the first space, except for the second space.

In accordance with another aspect of the present disclosure, an electronic device includes a housing configured to form at least a portion of an outer surface of the electronic device and to form a space therein; a battery disposed inside the housing; a circuit board disposed inside the housing; and a gas sensor module including at least one gas sensor and mounted in the circuit board, wherein the housing includes a vent configured to introduce outdoor air into the electronic device; a battery chamber containing the battery; a hole disposed in at least a portion of the battery chamber and configured to introduce a gas leaked from the battery; and a cavity disposed between the battery chamber and the vent, wherein the gas sensor is disposed inside the cavity.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The objects, features, and advantages of the present disclosure will be more apparent from the following detailed description in conjunction with the accompanying drawings, in which.

DETAILED DESCRIPTION

FIGS. 1 through 6, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
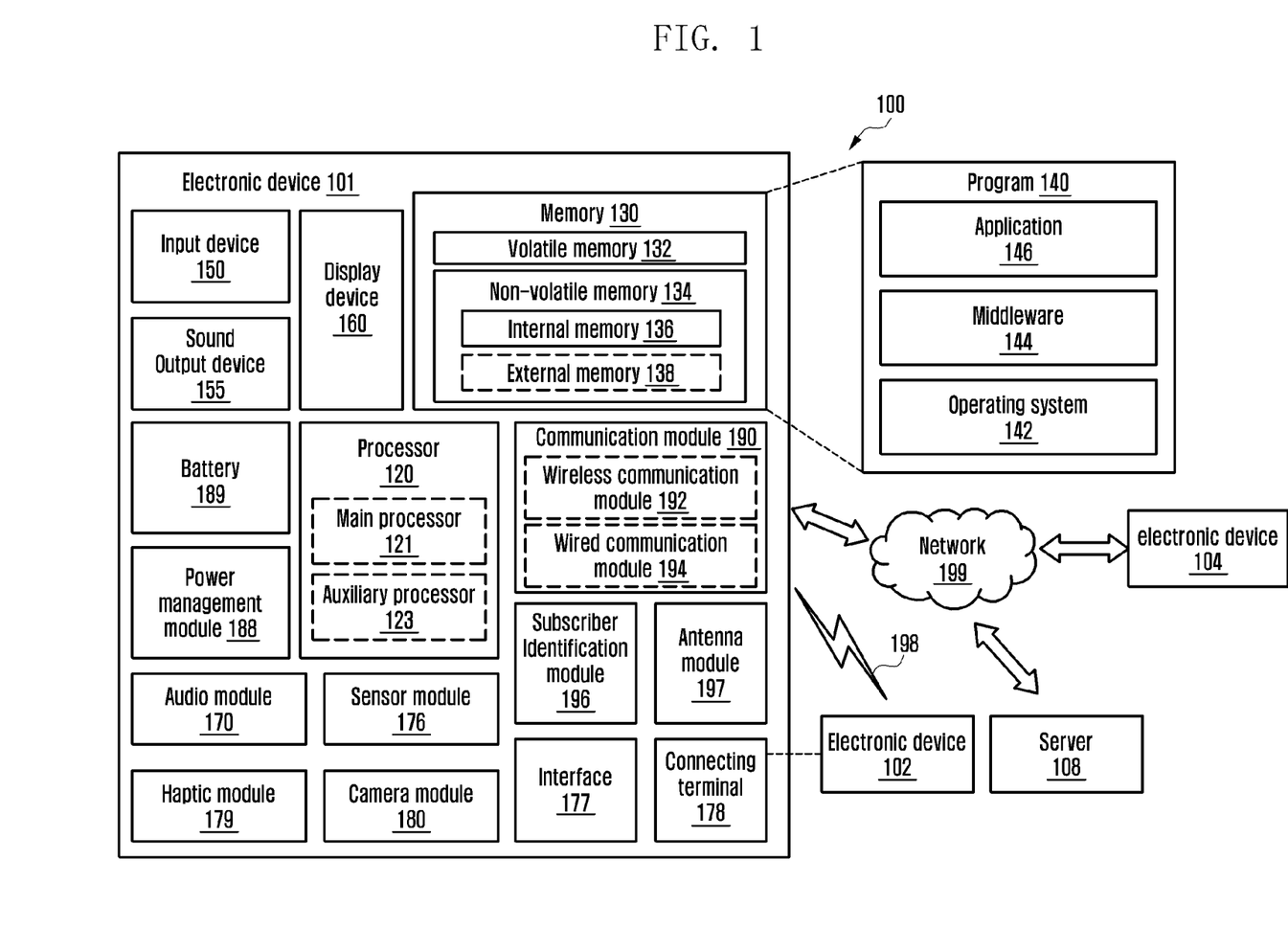
FIG. 1 illustrates a block diagram of a configuration of an electronic device in a network environment according to various embodiments.

FIG. 1 illustrates a block diagram of an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120 and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally, or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150 or output the sound via the sound output device 155 or a headphone of an external electronic device (e.g., an electronic device 102) directly (e.g., wired) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wired) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1$^{st}$" and "2nd," or "first" and "second" may be used to simply distinguish a corresponding component from another and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively, or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
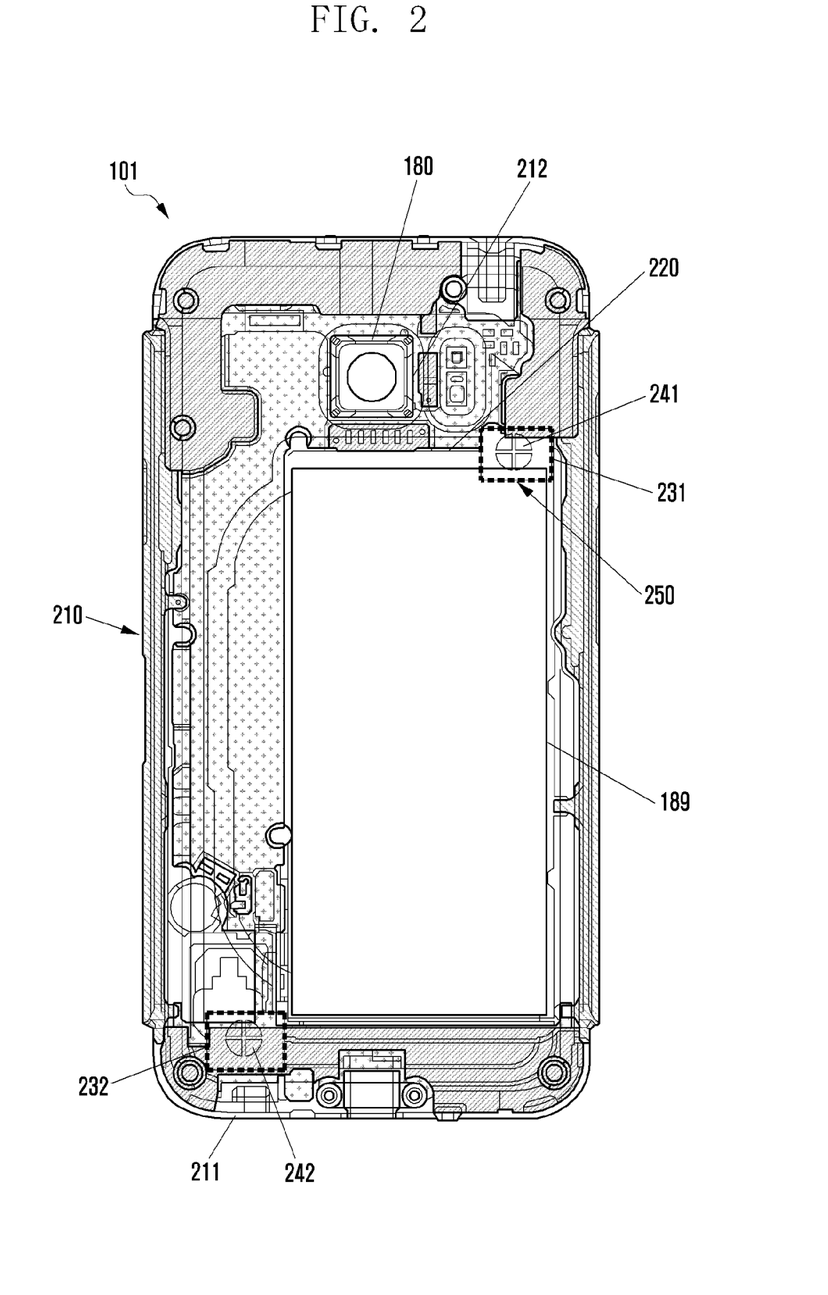
FIG. 2 illustrates a diagram of a structure capable of detecting a battery status of an electronic device according to various embodiments of the present disclosure.

FIG. 2 illustrates a diagram of a structure capable of detecting a battery status of an electronic device 101 according to various embodiments of the present disclosure.

According to various embodiments, the electronic device 101 may include a housing 210, a battery chamber 220, and at least one of cavities 231 and 232.

The housing 210 may include, for example, a bezel structure at a side portion thereof. The housing 210 may include at least one of vents 211 and 212.

At least one of the vents 211 and 212 is an element for adjusting a difference in atmospheric pressure between the inside and the outside of the housing 210 of the electronic device 101 and may include a foreign substance prevention structure for preventing a foreign substance from being entered from the outside and for smooth air circulation. A foreign substance prevention structure contained in at least one of the vents 211 and 212 may include a membrane structure using waterproof fabric (e.g., GORE-TEX®).

At least one of the vents 211 and 212 may be included in at least a portion of the housing 210 and may include, for example, a microphone hole, speaker hole, and connector hole (e.g., a universal serial bus (USB) and an earphone jack).

At least one of the vents 211 and 212 is an element for reducing a difference in atmospheric pressure between outdoor air and indoor air and may be punched or molded separately from the microphone hole, the speaker hole, and the connector hole upon producing.

At least one of the vents 211 and 212 may be disposed adjacent to the camera module 180.

At least one of the vents 211 and 212 may be connected to at least one of the cavities 231 and 232, respectively.

At least one of the cavities 231 and 232 may be disposed inside the housing 210, and at least one of sensor modules 241 and 242 may be disposed on at least one of the cavities 231 and 232, respectively.

At least one of the cavities 231 and 232 may include at least one wall forming a space.

Figure 3:
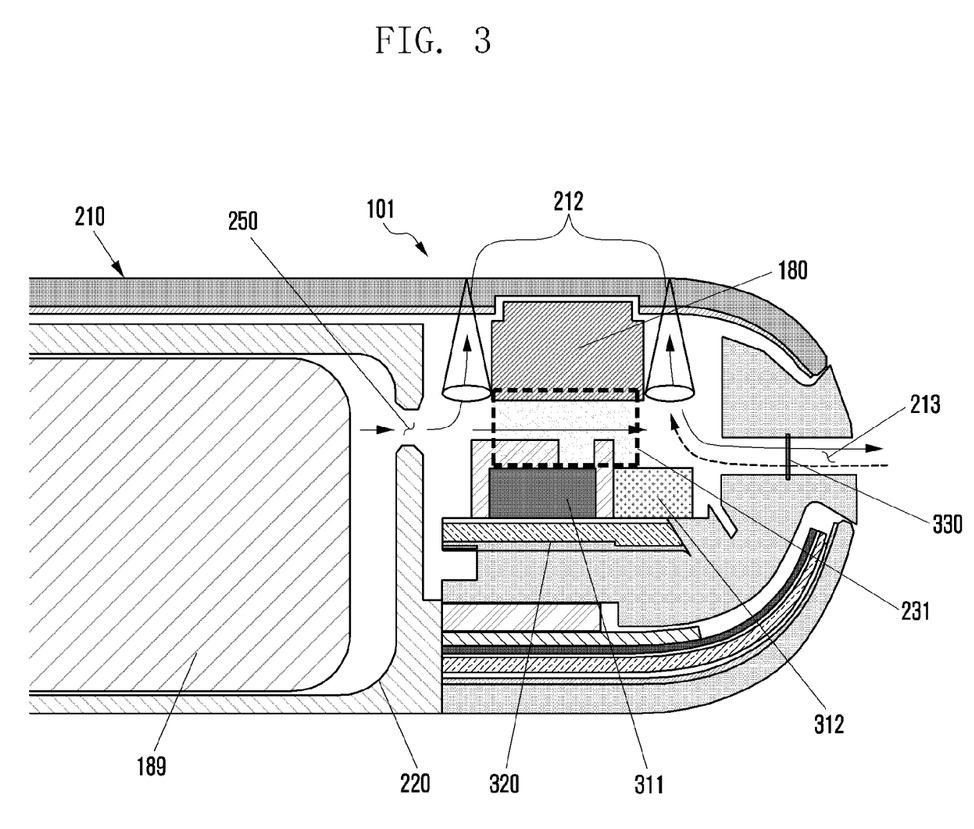
FIG. 3 illustrates a diagram of a structure capable of detecting a battery status of an electronic device according to various embodiments of the present disclosure.

Each of at least one of the sensor modules 241 and 242 may include at least one gas sensor (shown in FIG. 3).

At least one gas sensor may include a metal oxide (MOX) sensor. At least one gas sensor may be disposed in a partial space of at least one of the cavities 231 and 232 to measure a gas discharged from a battery 189 disposed within the housing 210 or air entered from the outside of an electronic device (not shown) through at least one of the vents 211 and 212.

Each of at least one of the sensor modules 241 and 242 may further include an atmospheric pressure sensor (not shown).

At least one of the cavities 231 and 232 may be partially connected to at least one of the vents 211 and 212, respectively and may be partially connected to a hole 250.

The hole 250 may be disposed at least partially in the battery chamber 220. The hole 250 disposed at least partially in the battery chamber 220 may be a passage of a gas discharged from a battery 189. The hole 250 may be punched or shaped upon producing the electronic device 101.

At least one of the cavities 231 and 232 may collect a gas discharged from the hole 250 to enable at least one gas sensor to analyze the collected gas and provide a space to discharge the collected gas to the outside through at least one of the vents 211 and 212.

The battery chamber 220 may be disposed inside or in at least a portion of the housing 210, and the battery chamber 220 may be separated from at least a portion of the battery 189 to protect the battery 189.

The battery chamber 220 may dispose the battery 189 on an inner space and separate the battery 189 from other devices included in the electronic device 101.

The battery chamber 220 may be a portion of the housing 210 of the electronic device 101 configured with a bracket.

The battery chamber 220 may include at least one wall forming a space.

The battery chamber 220 may include a hole 250 in at least a portion thereof, and a gas discharged from the battery 189 through the hole 250 may be transferred to the at least one of the cavities 231 and 232.

The hole 250, at least one of the cavities 231 and 232, and at least one of the vents 211 and 212 included in at least a portion of the battery chamber 220 may have a duct structure that can discharge a gas discharged from the battery 189 to the outside. The hole 250 or at least one of the vents 211 and 212 may be referred to as an opening.

FIG. 3 illustrates a diagram of a structure capable of detecting a battery status of an electronic device 101 according to various embodiments of the present disclosure.

According to various embodiments, the electronic device 101 may include a housing 210, battery chamber 220, and cavity 231.

The housing 210 may include electronic components, a battery 189, and a gas sensor 311 related to the electronic device 101 therein. The housing 210 may include at least one of the vents 212 and 213.

At least one of the vents 212 and 213 is an element for adjusting a difference in atmospheric pressure between the inside and the outside of the housing 201 of the electronic device 101 and may include a foreign substance prevention structure 330 for preventing a foreign substance from being entered from the outside and for smooth air communication. The foreign substance prevention structure 330 included in at least one of the vents 212 and 213 may include a membrane structure using waterproof fabric (e.g., GORE-TEX®), and the like.

At least one of the vents 212 and 213 may be formed (or disposed) in a portion of the housing 210 and may include, for example, a microphone hole, speaker hole, and connector hole (e.g., USB and earphone jack).

At least one of the vents 212 and 213 is an element for reducing a difference in atmospheric pressure between outdoor air and indoor air and may be punched or shaped in a portion of the housing 210 separately from the microphone hole, the speaker hole, and the connector hole upon producing.

At least one of the vents 212 and 213 may be disposed adjacent to a camera module 180.

For example, the first vent 212 may be disposed through a portion of the housing 210 adjacent to the camera module 180 or may be formed in at least a portion of the housing 210 including the camera module 180.

The second vent 213 may include, for example, a microphone hole, speaker hole, and connector hole (e.g., USB and earphone jack).

The second vent 213 may be formed (or disposed) in the form of, for example, a microphone hole, speaker hole, and connector hole (e.g., USB and earphone jack) in a portion of the housing 210. At least one of the vents 212 and 213 may be connected to the cavity 231.

The cavity 231 may be disposed inside the housing 210, and a sensor module (e.g., 241 of FIG. 2) may be disposed in at least one cavity 231. The sensor module (e.g., 241 of FIG. 2) may include a gas sensor 311 and/or an atmospheric pressure sensor 312. The gas sensor 311 may detect and analyze a gas discharged from the battery 189. The gas sensor 311 may transfer the detected and analyzed gas information to the processor 120. The atmospheric pressure sensor 312 may measure an atmospheric pressure using air outside the housing 210 entered through at least one of the vents 212 and 213.

The gas sensor 311 may be a metal oxide (MOX) sensor. The gas sensor 311 may be disposed in a partial space of the cavity 231 to measure components contained in a gas discharged from the battery 189 disposed inside the housing 210 or air entered from the outside of the electronic device 101 through at least one of the vents 212 and 213.

A portion of the cavity 231 may be connected to at least one of the vents 212 and 213 and may be connected to a hole 250.

The hole 250 may be formed in at least a portion of the battery chamber 220. The hole 250 formed in at least a portion of the battery chamber 220 may be a passage for the gas discharged from the battery 189. The hole 250 may be punched or shaped in at least a portion of the housing 210 upon producing the electronic device 101.

The cavity 231 may collect a gas discharged from the hole 250 to enable at least one gas sensor 311 to analyze the collected gas and provide a space to enable the collected gas to be discharged outside through at least one of the vents 212 and 213.

The cavity 231 may include at least one wall forming a space.

The battery chamber 220 may be disposed inside the housing 210 or in at least a portion of the housing 210 and may be separated from at least a portion of the battery 189 to protect the battery 189.

The battery chamber 220 may dispose the battery 189 on an inner space and may be separated from other devices included in the electronic device 101.

The battery chamber 220 may be a portion of the housing 210 of the electronic device 101 configured with a bracket.

The battery chamber 220 may include at least one wall forming a space.

The battery chamber 220 may include a hole 250 in at least a portion thereof and may transfer a gas discharged from the battery 189 to the cavity 231 through the hole 250.

The hole 250 and the cavity 231 in the battery chamber 220 and at least a portion of the vents 212 and 213 may form a duct structure that may discharge a gas discharged from the battery 189 to the outside. The hole 250 or at least one of the vents 212 and 213 may be referred to as an opening.

Figure 4:
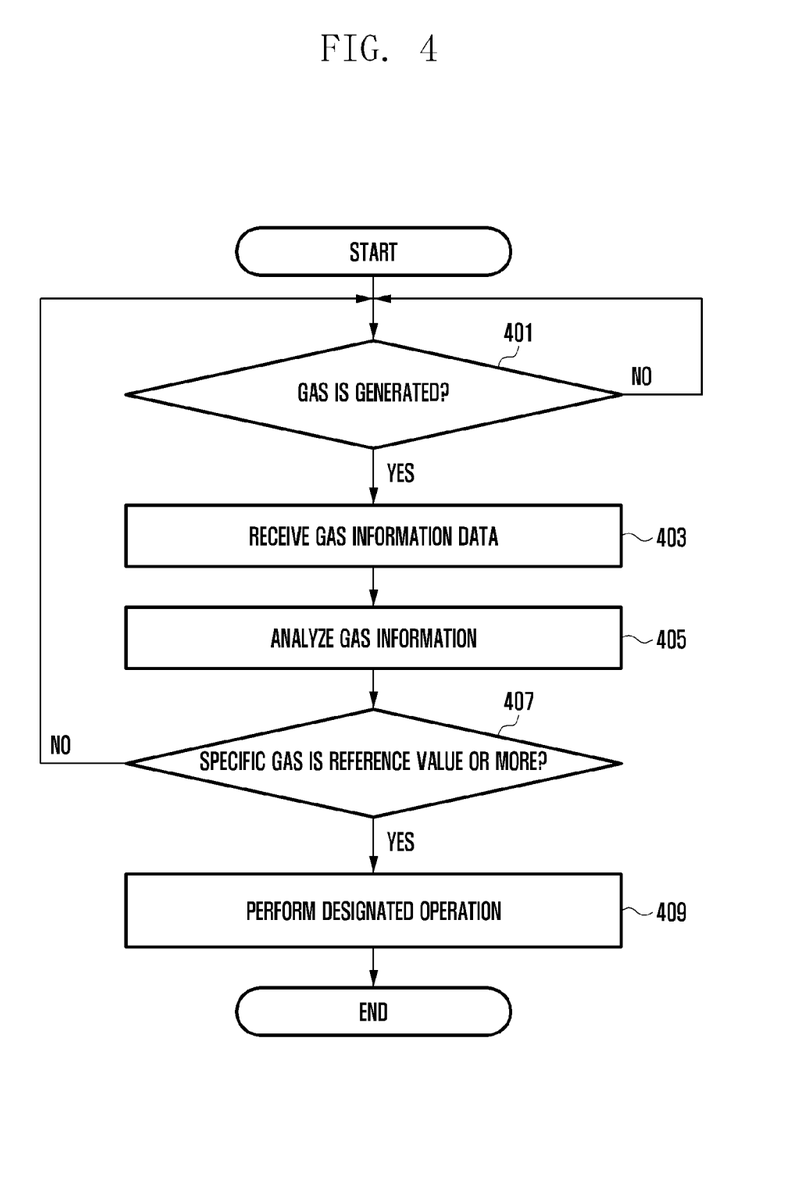
FIG. 4 illustrates a flowchart of a method of detecting a battery status according to various embodiments of the present disclosure.

FIG. 4 illustrates a flowchart of a method of detecting a battery status according to various embodiments of the present disclosure.

In operation 401, the gas sensor (e.g., 311 of FIG. 3) of the electronic device 101 may detect whether a gas is generated.

If a gas is not generated, the process continues in operation 401.

If a gas is generated, the process continues in operation 403.

In operation 403, the processor (e.g., 120 of FIG. 1) of the electronic device 101 may receive gas information data from the gas sensor (e.g., 311 of FIG. 3). The operation of receiving gas information data may be, for example, an operation of receiving information on a type and concentration of the gas contained in the gas.

In operation 405, the processor (e.g., 120 of FIG. 1) of the electronic device 101 may analyze gas information using gas information data.

In various embodiments, in operation 405, the gas sensor (e.g., 311 of FIG. 3) of the electronic device 101 may analyze gas information using gas information data.

The operation of analyzing gas information may be an operation of analyzing information on a type and concentration of the gas.

In operation 407, the processor (e.g., 120 of FIG. 1) of the electronic device 101 may determine whether a specific gas is a reference value or more.

If a specific gas is less than a reference value, the process continues in operation 401.

If a specific gas is a reference value or more, the process continues in operation 409.

In various embodiments, in operation 407, the gas sensor (e.g., 311 of FIG. 3) of the electronic device 101 may determine whether a specific gas is a reference value or more.

In various embodiments, in operation 407, if the specific gas is less than a reference value, the process continues in operation 401.

In various embodiments, in operation 407, if a specific gas is a reference value or more, the process continues in operation 409.

In operation 407, the specific gas may be a gas discharged from the battery 189 and may be a hydrogen (H2) gas or an organic compound gas discharged at a high concentration when the battery 189 is in an abnormal state, and a reference value thereof may be a specific concentration. The specific concentration may be arbitrarily determined and may be a concentration close to an explosion threshold.

In operation 407, if the specific gas is a reference value or more, the electronic device 101 may determine an abnormal operation of the battery 189 under the control of the processor (e.g., 120 of FIG. 1).

In operation 409, the electronic device 101 may perform a designated operation under the control of the processor (e.g., 120 of FIG. 1).

For example, the designated operation may notify a user of an abnormal operation of the battery 189 and update log information.

The operation of notifying the user of an abnormal operation of the battery 189 may be, for example, an operation of displaying a message related to abnormality of the battery 189 on the display device 160.

The operation of updating log information may include an operation of performing a photographing operation through the camera module 180. As illustrated in FIGS. 2 and 3, when at least one vent 212 is disposed adjacent to the camera module 180, the gas passes over a window or an image sensor of the camera module 180. When the electronic device 101 is exploded or ignited because of a gas having a specific concentration or more, a combustion gas or an ignition scene may be photographed through the camera module 180. The captured image may be updated as log information.

The log information may be a concentration and type of a gas detected when an abnormal symptom is detected, a gas detection time, and the serial number of the electronic device 101.

The operation of updating log information may include at least one of an operation of storing log information in the memory 130 of the electronic device 101 and an operation of transmitting log information to the server (e.g., 108 of FIG. 1) through the communication module 190.

Figure 5:
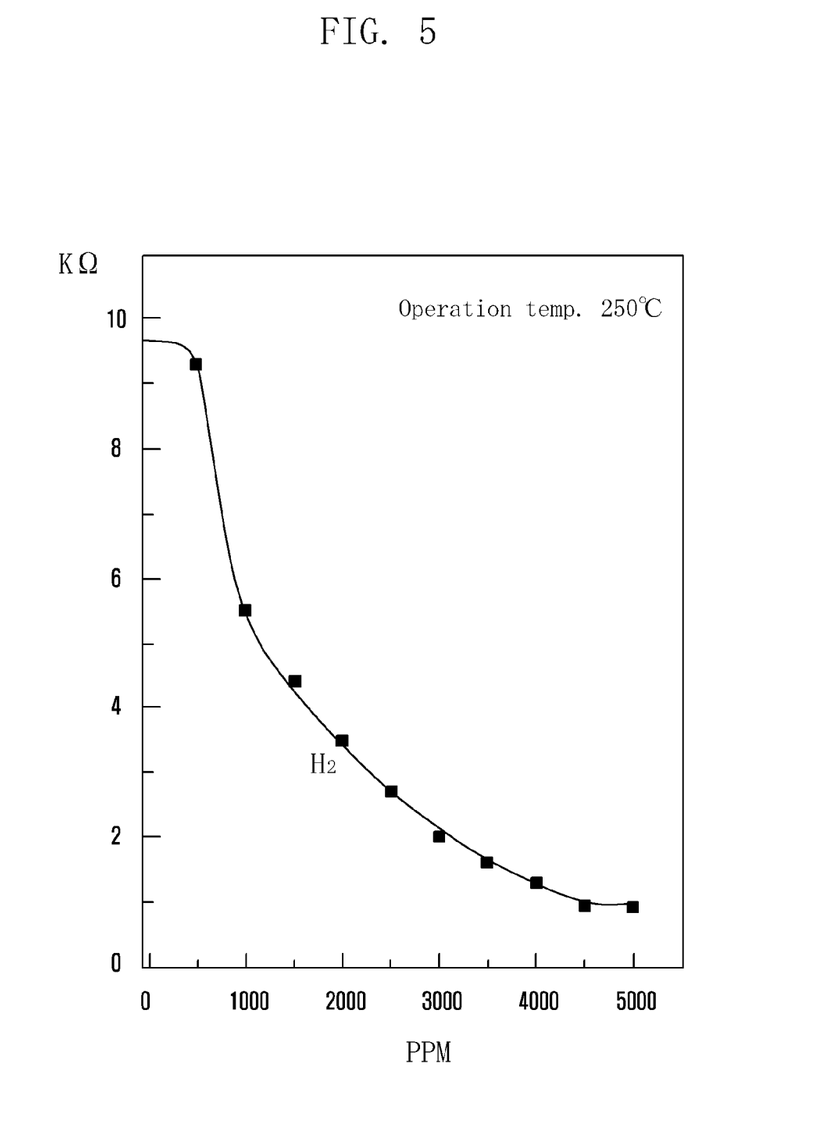
FIG. 5 illustrates a graph of a resistance value of a gas that can be detected by an electronic device according to various embodiments of the present disclosure.

FIG. 5 illustrates a graph of a resistance value of a gas that can be detected by an electronic device 101 according to various embodiments of the present disclosure.

X-axis is a concentration of a gas, and Y-axis is a resistance value. The higher the gas concentration, the lower the resistance value. The electronic device 101 may store a resistance value according to the concentration in the memory 130 as look-up data. The processor (e.g., 120 of FIG. 1) and/or the gas sensor (e.g., 311 of FIG. 3) may perform the operation of FIG. 4 using the look-up data, which are a resistance value according to the concentration stored in the memory 130 of the electronic device 101.

Figure 6:
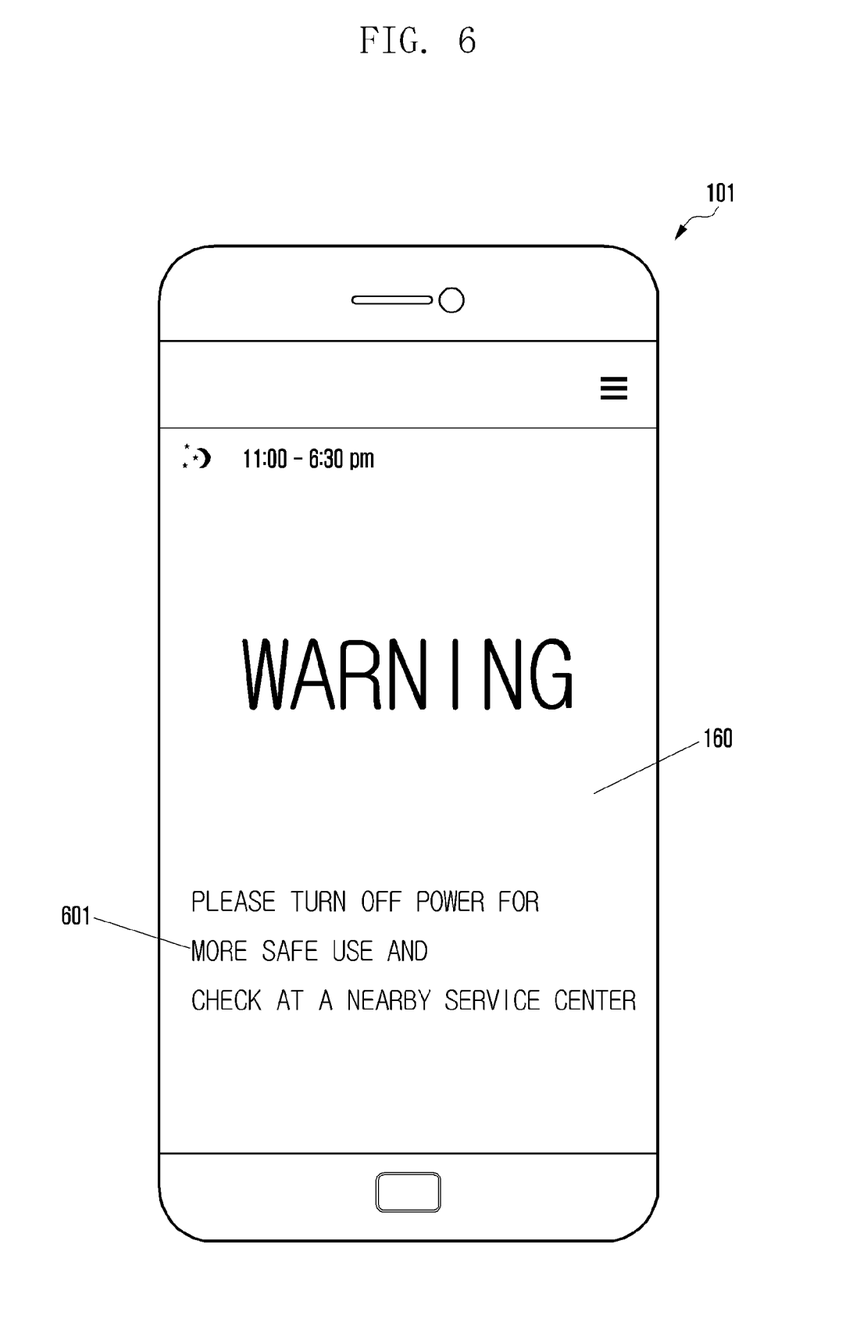
FIG. 6 illustrates a diagram of an operation in which an electronic device notifies a user of a battery abnormal operation according to various embodiments of the present disclosure.

FIG. 6 illustrates a diagram of an operation in which an electronic device 101 notifies a user of an abnormal operation of a battery 189 according to various embodiments of the present disclosure.

For example, when it is detected by the gas sensor 311 that a concentration of a gas leaked from the battery 189 exceeds a predetermined threshold, the display device 160 of the electronic device 101 according to various embodiments of the present disclosure may display an user interface (UI) related to gas leakage to a user of the electronic device 101 under the control of the processor 120. For example, the UI may include a warning such as "Turn off power because abnormality is detected in a battery" or "Please turn off power for more safe use and check at a nearby service center." According to an embodiment, when it is detected that a concentration of a gas leaked from the battery 189 exceeds a predetermined threshold, the processor 120 may transmit the serial number of the electronic device 101 and detected gas related information to, for example, a server (e.g., the server 108 of FIG. 1) of a service center through the network (e.g., the second network 199 of FIG. 1) and turn off power of the electronic device 101, thereby preventing an accident to be caused by the battery 189.

An electronic device according to various embodiments disclosed in this document may be various types of devices. The electronic device may include, for example, at least one of a portable communication device (e.g., a smart phone), computer device, portable multimedia device, portable medical device, camera, wearable device, and home appliance. The electronic device according to an embodiment of this document is not limited to the above-described devices.

It should be understood that various embodiments of this document and terms used in the embodiments do not limit technology described in this document to a specific embodiment and include various changes, equivalents, and/or replacements of a corresponding embodiment. The same reference numbers are used throughout the drawings to refer to the same or like parts. Unless the context otherwise clearly indicates, words used in the singular include the plural, and the plural includes the singular. In this document, an expression such as "A or B" and "at least one of A or/and B", "A, B or, C" or "at least one of A, B, or/and C" may include all possible combinations of together listed items. An expression such as "first" and "second" used in this document may indicate corresponding components regardless of order or importance, and such an expression is used for distinguishing a component from another component and does not limit corresponding components. When it is described that a component (e.g., a first component) is "(functionally or communicatively) coupled to" or is "connected to" another component (e.g., a second component), it should be understood that the component may be directly connected to the another component or may be connected to the another component through another component (e.g., a third component).

A term "module" used in this document includes a unit configured with hardware, software, or firmware and may be interchangeably used with a term such as a logic, logic block, component, or circuit. The module may be an integrally configured component or a minimum unit that performs at least one function or a portion thereof. For example, the module may be configured with an application-specific integrated circuit (ASIC).

Various embodiments of this document may be implemented with software (e.g., the program 140) including instructions stored on a machine (e.g., a computer)-readable storage medium (e.g., the internal memory 136 or the external memory 138). The machine is a device that calls a stored instruction from a storage medium and that may operate according to the called instruction and may include an electronic device (e.g., the electronic device 101) according to disclosed embodiments. When the command is executed by a processor (e.g., the processor 120), the processor may perform a function corresponding to the command directly or using other components under the control of the processor. The command may include a code generated or executed by a compiler or an interpreter. The machine readable storage medium may be provided in a format of a non-transitory storage medium. Here, "non-transitory" means that a storage medium does not include a signal and is tangible and does not divide that data are semi-permanently or temporarily stored at a storage medium.

According to an embodiment, a method according to various embodiments disclosed in this document may be included and provided in a computer program product. The computer program product may be traded as a product between a seller and a buyer. The computer program product may be distributed in online in a form of a machine readable storage medium (e.g., compact disc read only memory (CD-ROM) or through an application store (e.g., play store™). In the case of online distribution, at least a portion of the computer program product may be at least temporarily stored or temporarily generated in a storage medium such as a server of a manufacturer, a server of an application store, or a memory of a relay server.

Each of components (e.g., modules or programs) according to various embodiments may be configured with a single entity or a plurality of entities, and some subcomponents of the foregoing subcomponents may be omitted or other subcomponents may be further included in various embodiments. Alternatively, or additionally, some components (e.g., modules or programs) may be integrated into one entity to perform the same or similar functions performed by each component prior to integration. According to various embodiments, operations performed by a module, a program, or another component may be sequentially, parallelly, repeatedly, or heuristically executed, at least some operation may be executed in different order or omitted, or another operation may be added.

An electronic device 101 according to various embodiments of the present disclosure can detect in real time gas leakage of a battery 189 occurring by exposure to a high temperature or a generated heat and control a status of the battery 189, thereby preventing a safety accident by the battery 189.

According to various embodiments of the present disclosure, by discharging a gas generated in the battery 189 to the outside of the electronic device 101, stability of the battery 189 to be used by the electronic device 101 can be secured.

According to various embodiments of the present disclosure, when an abnormal event occurs in a battery 189, the electronic device 101 can warn a user and obtain log information about the abnormal battery event.

Although embodiments of the present disclosure have been described in detail hereinabove, it should be clearly understood that many variations and modifications of the basic inventive concepts herein described, which may appear to those skilled in the art, will still fall within the spirit and scope of the embodiments of the present disclosure as defined in the appended claims.

What is claimed is:

1. An electronic device, comprising:
   a housing configured to form at least a portion of an outer surface of the electronic device;
   a battery disposed inside the housing in a battery chamber;
   a circuit board disposed inside the housing outside of the battery chamber;
   a gas sensor module comprising at least one gas sensor and mounted in the circuit board; and
   at least one wall disposed adjacent to the gas sensor module,
   wherein the at least one wall comprises a first opening configured to introduce a gas leaked from the battery and a second opening configured to introduce air outside the electronic device.

2. The electronic device of claim 1, further comprising a camera module disposed in the housing in an outward direction of the electronic device,
   wherein the second opening is disposed adjacent to the camera module.

3. The electronic device of claim 1, wherein the second opening is disposed in at least one of a speaker hole, microphone hole, connector hole, and button.

4. The electronic device of claim 1, further comprising a processor, wherein the processor is configured to:
   obtain a signal corresponding to gas information obtained from the at least one gas sensor;
   determine a status of the battery based on the signal; and
   perform a designated operation based on at least the determination of the status of the battery.

5. The electronic device of claim 4, wherein the processor is configured to perform an operation of updating log information related to the status of the battery as at least a portion of the designated operation.

6. The electronic device of claim 4, further comprising a display, wherein the processor is configured to perform an operation of displaying information corresponding to the status of the battery through the display as at least a portion of the designated operation.

7. An electronic device, comprising:
   a housing configured to form at least a portion of an outer surface of the electronic device and to form a first space therein;
   a battery disposed inside the housing in a battery chamber;
   a circuit board disposed inside the housing outside of the battery chamber; and
   a gas sensor module comprising at least one gas sensor and mounted in the circuit board,
   wherein the housing comprises:
   a first opening comprising a second space disposed in at least a portion of the first space and configured to dispose the battery within the second space and to introduce a gas leaked from the battery into at least a portion of the second space; and
   a second opening configured to introduce outdoor air into the electronic device in at least a portion thereof, and
   wherein the gas sensor is disposed in a partial area of the first space, except for the second space.

8. The electronic device of claim 7, further comprising a camera module disposed in the housing in an outward direction of the electronic device,
   wherein the second opening is disposed adjacent to the camera module.

9. The electronic device of claim 7, wherein the second opening is disposed in at least one of a speaker hole, microphone hole, connector hole, and button.

10. The electronic device of claim 7, further comprising a processor, wherein the processor is configured to:
obtain a signal corresponding to gas information obtained from the at least one gas sensor;
determine a status of the battery based on the signal; and
perform a designated operation based on at least the determination of the status of the battery.

11. The electronic device of claim 10, wherein the processor is configured to perform an operation of updating log information related to the status of the battery as at least a portion of the designated operation.

12. The electronic device of claim 10, further comprises a display,
wherein the processor is configured to perform an operation of displaying information corresponding to the status of the battery through the display as at least a portion of the designated operation.

13. An electronic device, comprising:
a housing configured to form at least a portion of an outer surface of the electronic device and to form a space therein;
a battery disposed inside the housing in a battery chamber;
a circuit board disposed inside the housing outside of the battery chamber; and
a gas sensor module comprising at least one gas sensor and mounted in the circuit board,
wherein the housing comprises:
a vent configured to introduce outdoor air into the electronic device;
a hole disposed in at least a portion of the battery chamber and configured to introduce a gas leaked from the battery; and
a cavity disposed between the battery chamber and the vent, wherein the gas sensor is disposed inside the cavity.

14. The electronic device of claim 13, further comprising a camera module disposed in the housing in an outward direction of the electronic device,
wherein the vent is disposed adjacent to the camera module.

15. The electronic device of claim 13, wherein the vent is disposed in at least one of a speaker hole, microphone hole, connector hole, and button.

16. The electronic device of claim 13, further comprising a processor, wherein the processor is configured to:
obtain a signal corresponding to gas information using the at least one gas sensor;
determine a status of the battery based on the signal; and
perform a designated operation based on at least the determination of the status of the battery.

17. The electronic device of claim 16, wherein the processor is configured to perform an operation of updating log information related to the status of the battery as at least a portion of the designated operation.

18. The electronic device of claim 16, further comprising a display,
wherein the processor is configured to perform an operation of displaying information corresponding to the status of the battery through the display as at least a portion of the designated operation.

19. The electronic device of claim 13, wherein the cavity comprises at least one opening.

20. The electronic device of claim 19, wherein the at least one opening comprises:
a first opening formed to correspond to the hole; and
a second opening formed to correspond to the vent.

* * * * *